(12) United States Patent
Wu et al.

(10) Patent No.: US 11,818,542 B2
(45) Date of Patent: Nov. 14, 2023

(54) CAPACITIVE MICROPHONE WITH WELL-CONTROLLED UNDERCUT STRUCTURE

(71) Applicant: GMEMS TECH SHENZHEN LIMITED, Shenzhen (CN)

(72) Inventors: Guanghua Wu, Dublin, CA (US); Xingshuo Lan, San Jose, CA (US); Zhixiong Xiao, Fremont, CA (US)

(73) Assignee: GMEMS TECH SHENZHEN LIMITED, Shenzhen (CN)

( * ) Notice: Subject to any disclaimer, the term of this patent is extended or adjusted under 35 U.S.C. 154(b) by 114 days.

(21) Appl. No.: 17/448,352

(22) Filed: Sep. 21, 2021

(65) Prior Publication Data

US 2022/0095057 A1 Mar. 24, 2022

Related U.S. Application Data

(60) Provisional application No. 63/081,877, filed on Sep. 22, 2020.

(51) Int. Cl.
*H04R 19/04* (2006.01)
*B81B 3/00* (2006.01)

(52) U.S. Cl.
CPC .......... *H04R 19/04* (2013.01); *B81B 3/0021* (2013.01); *B81B 2201/0257* (2013.01); *B81B 2203/0127* (2013.01); *B81B 2203/0307* (2013.01); *H04R 2201/003* (2013.01)

(58) Field of Classification Search
CPC .............. H04R 19/04; H04R 2201/003; H04R 19/005; B81B 3/0021; B81B 2201/0257; B81B 2203/0127; B81B 2203/0307; B81B 2207/015; B81C 2201/0132; B81C 1/00595; B81C 2201/0133
USPC .......................................................... 381/174
See application file for complete search history.

(56) References Cited

U.S. PATENT DOCUMENTS

| | | | | |
|---|---|---|---|---|
| 2010/0254560 | A1* | 10/2010 | Mehregany | H04R 19/005 381/361 |
| 2014/0291786 | A1* | 10/2014 | Zoellin | B81B 3/0051 257/416 |
| 2016/0112807 | A1* | 4/2016 | Yuan | H04R 19/005 381/174 |
| 2018/0262845 | A1* | 9/2018 | Shi | B81B 3/007 |
| 2018/0317033 | A1* | 11/2018 | Zhang | B81B 3/007 |

* cited by examiner

*Primary Examiner* — Sean H Nguyen
(74) *Attorney, Agent, or Firm* — George Guosheng Wang; Upstream Research and Patent LLC

(57) ABSTRACT

The present invention provides a MEMS microphone comprising (i) a substrate layer, (ii) a fixed backplate, and (iii) an intermediate layer sandwiched between the substrate layer and the fixed backplate. The substrate layer has a first opening through the thickness of the substrate layer. The intermediate layer has a second opening through the thickness of the intermediate layer. The fixed backplate forms a ceiling of the second opening, and the second opening is larger than the first opening and extends into the first opening, forming a looped recess ("undercut"). The looped recess is defined by a looped ledge on the substrate, a looped sidewall around the second opening, and a looped ceiling from the fixed backplate. The looped sidewall and the looped ceiling are made of a same material.

19 Claims, 17 Drawing Sheets

105b and 1031 are integrated and made of same material

CAPACITIVE MICROPHONE WITH WELL-CONTROLLED UNDERCUT STRUCTURE

CROSS-REFERENCE TO RELATED U.S. APPLICATIONS

This application expressly claims the benefit under 35 U.S.C. Section 119(e) and Article 4 of the Stockholm Act of the Paris Convention for the Protection of Industrial Property of U.S. Provisional Patent Application No. 63/081,877, filed Sep. 22, 2020, and entitled "Several Designs for Parallel Plates Style Microphones and Methods Thereof," the entire disclosure of which is hereby incorporated by reference.

FIELD OF THE INVENTION

The present invention generally relates to a parallel-plate capacitive microphone with a novel and well-controlled undercut structure. The microphone of the invention may find applications in smart phones, telephones, hearing aids, public address systems for concert halls and public events, motion picture production, live and recorded audio engineering, two-way radios, megaphones, radio and television broadcasting, and in computers for recording voice, speech recognition, VoIP, and for non-acoustic purposes such as ultrasonic sensors or knock sensors, among others.

BACKGROUND OF THE INVENTION

A microphone is a transducer that converts sound into an electrical signal. Among different designs of microphone, a capacitive microphone or a condenser microphone is conventionally constructed employing the so-called "parallel-plate" capacitive design. Unlike other microphone types that require the sound wave to do more work, only a small mass in capacitive microphones needs be moved by the incident sound wave. Capacitive microphones generally produce a high-quality audio signal, and they are now the popular choice in consumer electronics, laboratory and recording studio applications, ranging from telephone transmitters through inexpensive karaoke microphones to high-fidelity recording microphones.

FIG. 1 is a schematic diagram of parallel capacitive microphone in the prior art. Two thin layers 101 and 102 are placed closely in almost parallel. One of them is fixed backplate 101, and the other one is movable/deflectable membrane/diaphragm 102, which can be moved or driven by sound pressure. Diaphragm 102 acts as one plate of a capacitor, and the vibrations thereof produce changes in the distance between two layers 101 and 102, and changes in the mutual capacitance therebetween.

FIG. 2 shows a typical MEMS microphone structure in the prior art, which includes at least 4 layers (from top to bottom): movable diaphragm 102, fixed backplate 101, etch stop material 103 and substrate 104. Sometimes, the etch stop material 103 under fixed backplate 101 is etched too much, forming an oversized undercut 105 as shown in FIG. 2. Such an oversized undercut may cause problems such as instability and unsatisfactory performance of the MEMS microphone structure.

Advantageously, the present invention provides an improved capacitive microphone with a novel undercut structure that can overcome the problems.

SUMMARY OF THE INVENTION

The present invention provides a MEMS microphone comprising (i) a substrate layer, (ii) a fixed backplate above the substrate layer and parallel thereto, and (iii) an intermediate layer sandwiched between the substrate layer and the fixed backplate. The substrate layer has a first opening through the thickness of the substrate layer. The intermediate layer has a second opening through the thickness of the intermediate layer. The fixed backplate forms a ceiling of the second opening, and the second opening is larger than the first opening and extends into the first opening, forming a looped recess ("undercut"). The looped recess is defined by a looped ledge on the substrate, a looped sidewall around the second opening, and a looped ceiling from the fixed backplate. The looped sidewall and the looped ceiling are made of a same material.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Throughout the specification and claims, the following terms take the meanings explicitly associated herein, unless the context clearly dictates otherwise. The phrase "in one embodiment" does not necessarily refer to the same embodiment, although it may. Furthermore, the phrase "in another embodiment" does not necessarily refer to a different embodiment, although it may. Thus, as described below, various embodiments of the invention may be readily combined without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
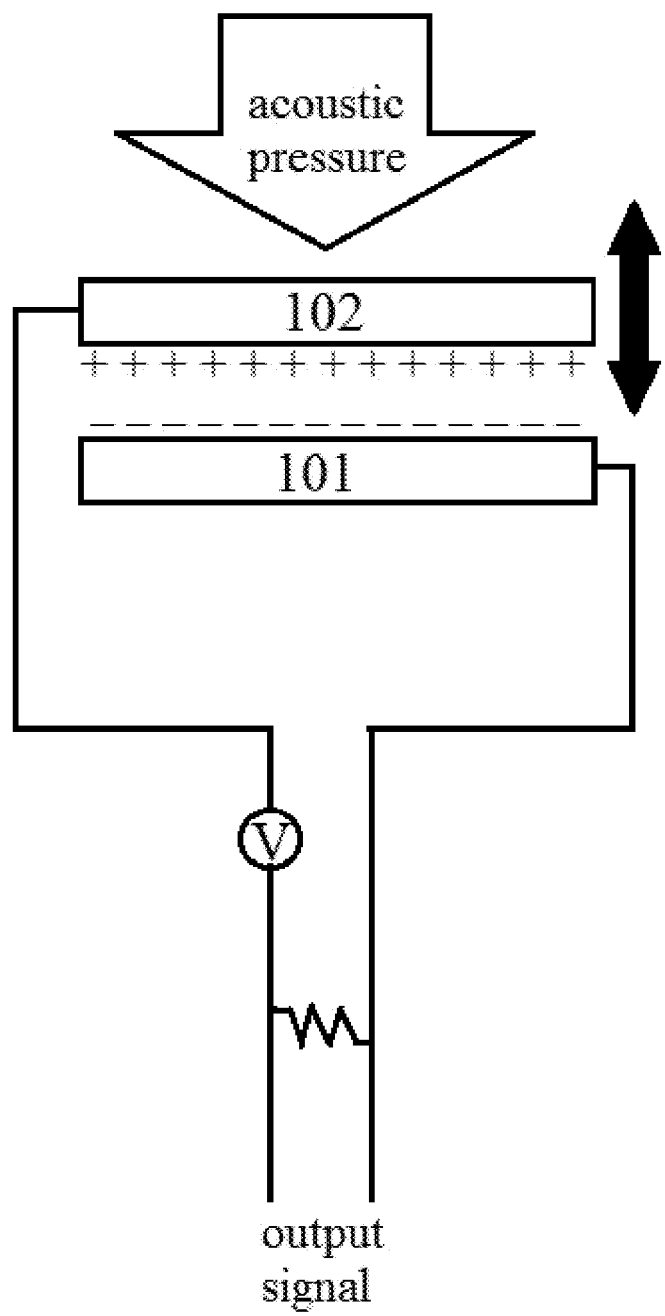
FIG. 1 shows a conventional capacitive microphone in the prior art.
Figure 2:
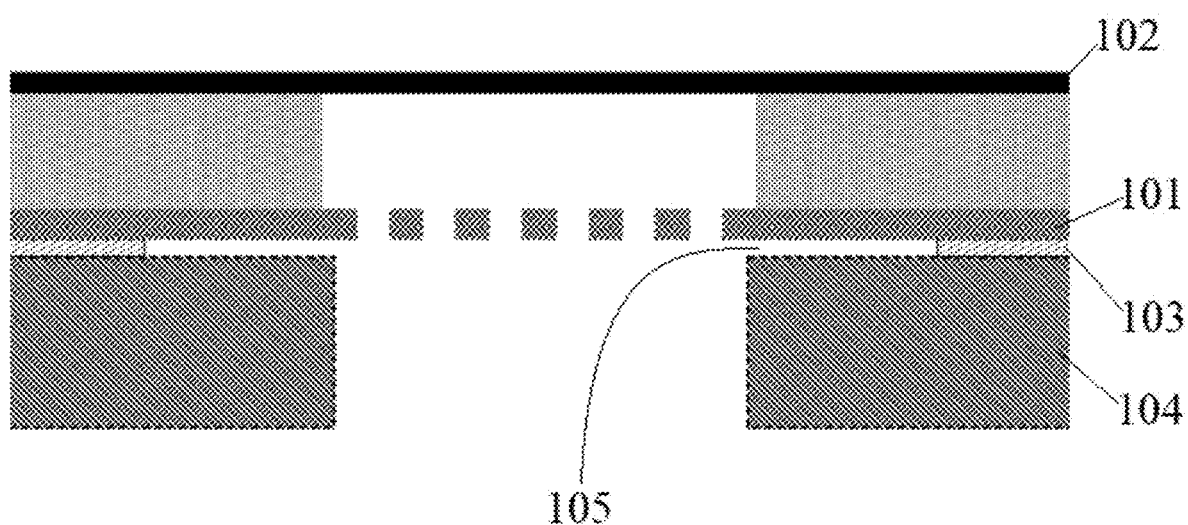
FIG. 2 schematically shows a capacitive microphone with an oversized undercut in the prior art.
Figure 3:
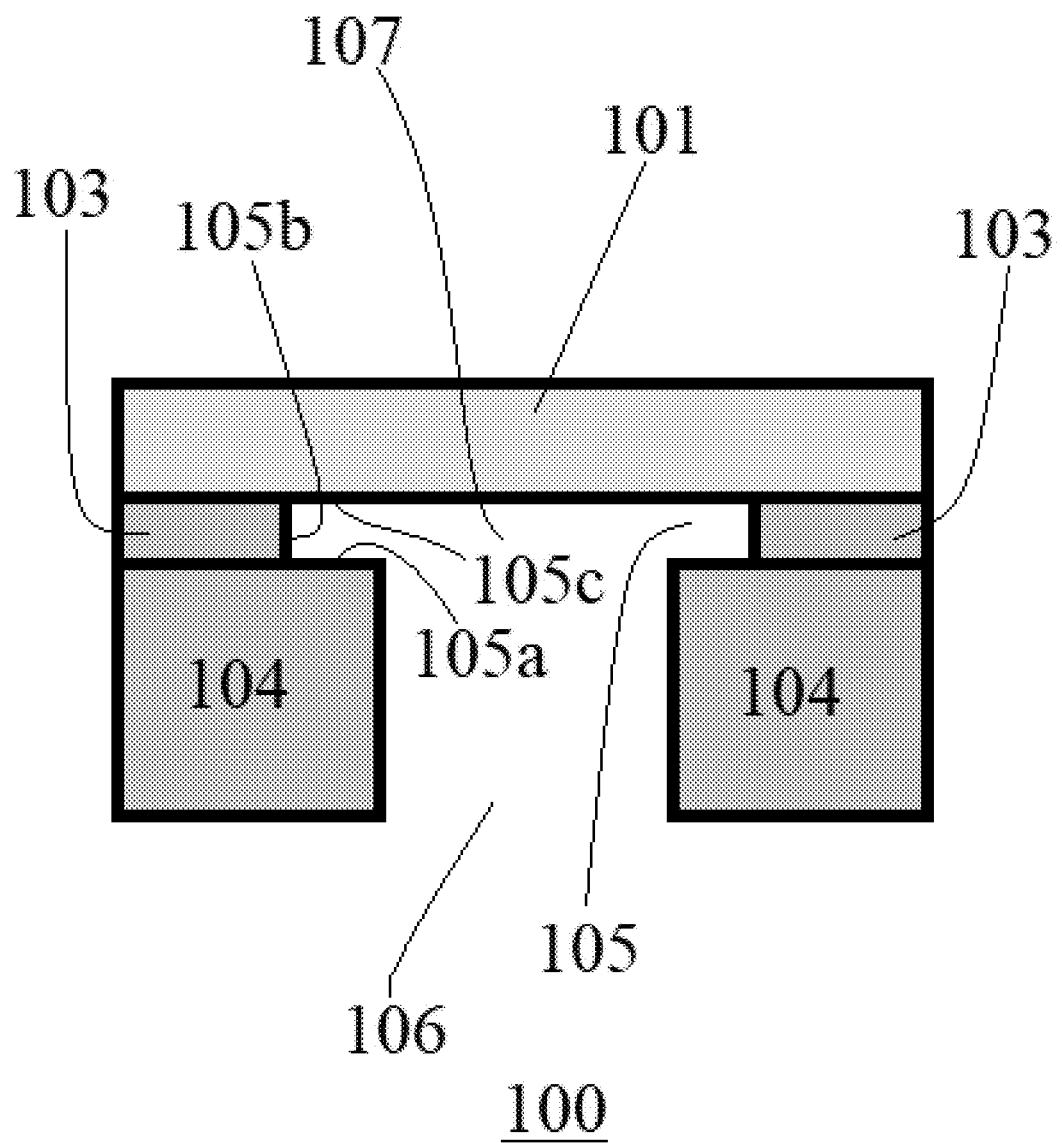
FIG. 3 illustrates a MEMS microphone with controlled undercut in accordance with an exemplary embodiment of the present invention.

Sometimes a MEMS (Microelectromechanical System) microphone is also known as a chip/silicon microphone. FIG. 3 illustrates a MEMS microphone in accordance with various exemplary embodiments of the present invention. The MEMS microphone 100 includes (i) a substrate layer 104, (ii) a fixed backplate 101 above the substrate layer 104 and parallel thereto, and (iii) an intermediate layer 103 sandwiched between the substrate layer 104 and the fixed backplate 101. In some embodiments, the intermediate layer 103 may be defined as a flat layer with a substantially uniform thickness. The substrate layer 104 has a first opening 106 (through hole or bore) through the thickness of the substrate layer 104. The intermediate layer 103 has a second opening 107 through the thickness of the intermediate layer 103. The fixed backplate 103 forms a ceiling of the second opening 107, and the second opening 107 is larger than the first opening 106 and it extends into the first opening 106, forming a looped recess 105 ("undercut"). In the present disclosure, the term "looped" represents a shape or contour of circle, square, or rectangular. The looped recess is thus defined by a looped ledge 105a on the substrate 104, a looped sidewall 105b around the second opening 107, and a looped ceiling 105c from the fixed backplate 103. The looped sidewall 105b and the looped ceiling 105c are made of a same material.

Figure 4:
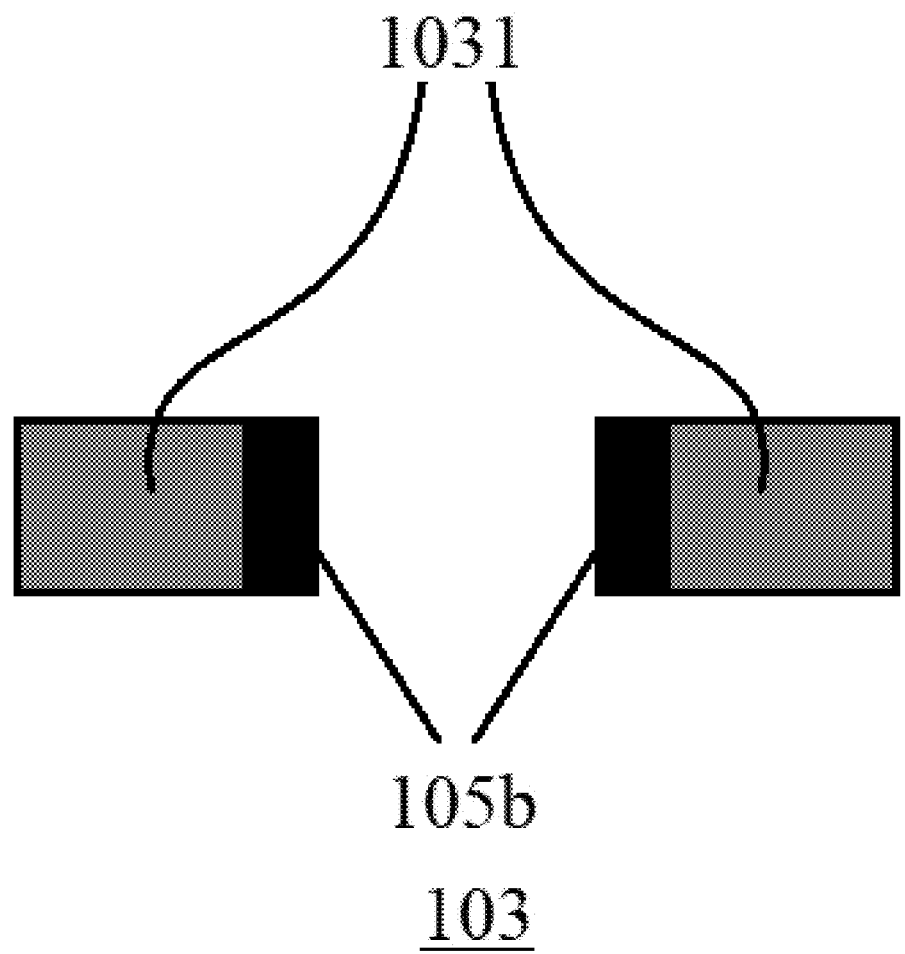
FIG. 4 illustrates the structure of an intermediate layer in accordance with an exemplary embodiment of the present invention.

As shown in FIG. 4, the intermediate layer 103 may consist of the looped sidewall 105b and a peripheral portion 1031 surrounding the looped sidewall 105b. In some embodiments, the peripheral portion 1031 is made of a material different from that of the looped sidewall 105b. For example, the substrate layer 104 may be made of Si, the looped sidewall 105b of the intermediate layer 103 may be made of silicon nitride, and the peripheral portion 1031 of the intermediate layer 103 may be made of silicon oxide. In preferred embodiments, the looped sidewall 105b of the intermediate layer 103 extends or integrates into at least a portion of the fixed backplate 104. In other words, at least a portion of the fixed backplate 104 that is immediately adjacent to and contacting an entire top surface of the looped sidewall 105b of the intermediate layer 103 is also made of silicon nitride. The peripheral portion of the intermediate layer may not extend into (i.e. materially distinct from) the fixed backplate 104. A portion of the fixed backplate 104 that immediately adjacent to and contacting an entire top surface of the peripheral portion 1031 of the intermediate layer 103 may also be made of silicon nitride.

In some other embodiments, the peripheral portion 1031 is made of a material same as the looped sidewall 105b material. For example, the substrate layer may be made of Si, and both the looped sidewall 105b and the peripheral portion 1031 of the intermediate layer 103 are made of silicon nitride. In preferred embodiments, both the looped sidewall 105b and the peripheral portion 1031 of the intermediate layer 103 extend into at least a portion of the fixed backplate 104. In other words, at least a portion of the fixed backplate 104 immediately adjacent to and contacting an entire top surface of both the looped sidewall 105b and the peripheral portion 1031 of the intermediate layer 103 is also made of silicon nitride.

The MEMS microphones of the invention such as those shown in FIGS. 3-4 can be fabricated using surface micromachining techniques, bulk micromachining techniques, high aspect ratio (HAR) silicon micromachining, and semiconductor processing techniques etc.

Surface micromachining creates structures on top of a substrate using a succession of thin film deposition and selective etching. Generally, polysilicon is used as one of the layers and silicon dioxide is used as a sacrificial layer which is removed or etched out to create the necessary void in the thickness direction. Added layers are generally very thin with their size varying from 2-5 micrometers. A main advantage is realizing monolithic microsystems in which the electronic and the mechanical components (functions) are built in on the same substrate. As the structures are built on top of the substrate and not inside it, the substrate's properties are not as important as in bulk micromachining, and the expensive silicon wafers can be replaced by cheaper substrates, such as glass, plastic, PET substrate, or other non-rigid materials. The size of the substrates can also be much larger than a silicon wafer.

Complicated components, such as movable parts, are built using a sacrificial layer. For example, a suspended cantilever can be built by depositing and structuring a sacrificial layer, which is then selectively removed at the locations where the future beams must be attached to the substrate (i.e. the anchor points). The structural layer is then deposited on top of the polymer and structured to define the beams. Finally, the sacrificial layer is removed to release the beams, using a selective etch process that will not damage the structural layer. There are many possible combinations of structural/sacrificial layer. The combination chosen depends on the process. For example it is important for the structural layer not to be damaged by the process used to remove the sacrificial layer.

Bulk micromachining produces structures inside a substrate by selectively etching inside the substrate. Bulk micromachining starts with a silicon wafer or other substrates which is selectively etched, using photolithography to transfer a pattern from a mask to the surface. Bulk micromachining can be performed with wet or dry etches, although the most common etch in silicon is the anisotropic wet etch. This etch takes advantage of the fact that silicon has a crystal structure, which means its atoms are all arranged periodically in lines and planes. Certain planes have weaker bonds and are more susceptible to etching. The etch results in pits that have angled walls, with the angle being a function of the crystal orientation of the substrate.

Silicon wafer can be anisotropically wet etched, forming highly regular structures. Wet etching typically uses alkaline liquid solvents, such as potassium hydroxide (KOH) or tetramethylammonium hydroxide (TMAH) to dissolve silicon which has been left exposed by the photolithography masking step. These alkali solvents dissolve the silicon in a highly anisotropic way, with some crystallographic orientations dissolving up to 1000 times faster than others. Such an approach is often used with very specific crystallographic orientations in the raw silicon to produce V-shaped grooves. The surface of these grooves can be atomically smooth if the etch is carried out correctly, and the dimensions and angles can be precisely defined.

In various embodiments of the invention, the microphone is made using a MEMS manufacturing process. Materials for the process include silicon, polymers, metals, and ceramics etc. Deposition processes can be carried out using physical deposition and chemical deposition. Patterning can be carried out using lithography, electron beam lithography, ion beam lithography, ion track technology, X-ray lithography, and diamond patterning. Wet etching can be carried out using isotropic etching, anisotropic etching, HF etching, and electrochemical etching. Dry etching can be carried out using vapor etching (e.g. xenon difluoride) and plasma etching (e.g. sputtering and reactive ion etching (RIE)). For example, in the manufacturing processes of capacitor microphones and acceleration sensors, wet etching is performed to remove sacrificing layers composed of silicon oxide by use of hydrofluoric acid (HF).

Figure 5:
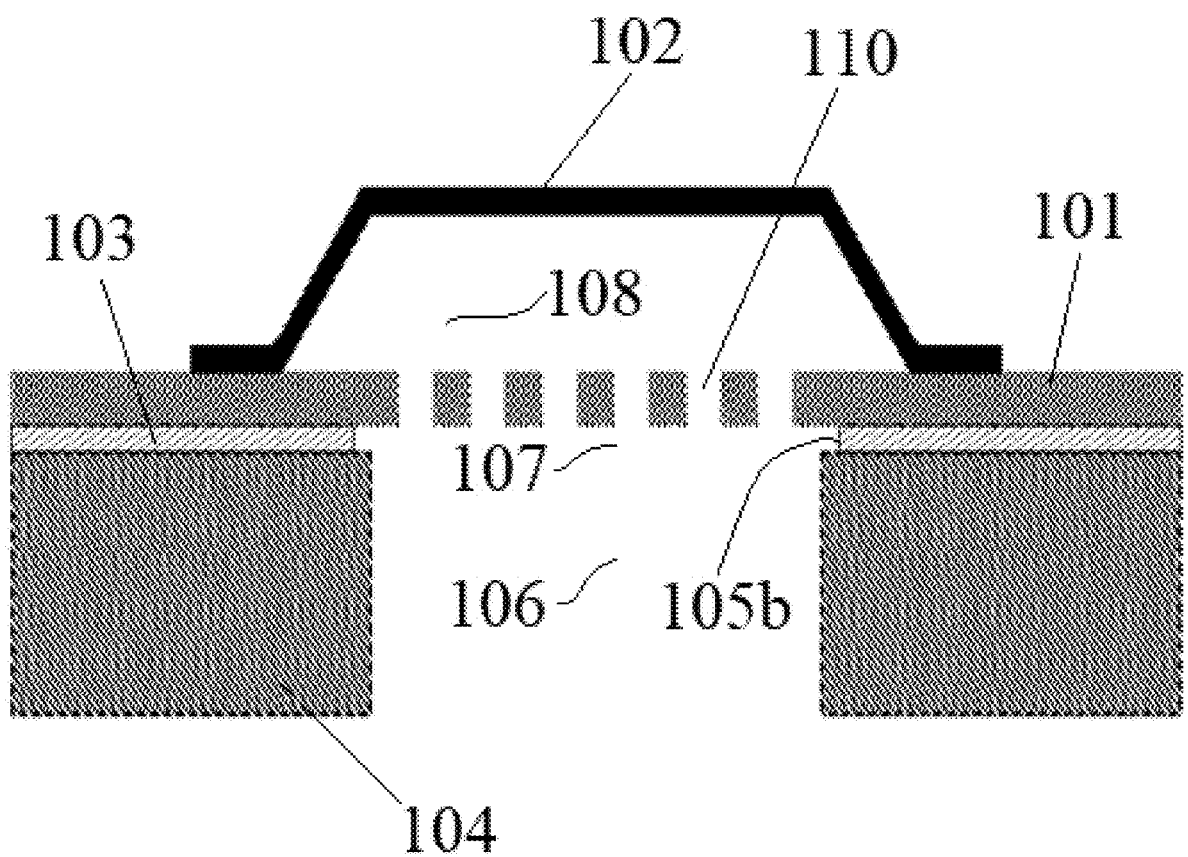
FIG. 5 illustrates a MEMS microphone with a movable diaphragm in accordance with an exemplary embodiment of the present invention.

As shown in FIG. 5, the MEMS microphone of the invention may further include a movable diaphragm 102 above the fixed backplate 101 and separated therefrom with a body of air 108. The movable diaphragm 102 may be made of polysilicon. However, electrical conductors may generally be made of polysilicon, gold, silver, nickel, aluminum, copper, chromium, titanium, tungsten, and platinum. In some embodiments, a pressure-sensitive diaphragm may be accompanied with an integrated preamplifier. For a digital MEMS microphone, it may include built in analog-to-digital converter (ADC) circuits on the same chip (e.g. a CMOS chip) making the chip a digital microphone and more readily integrated with digital products. The plate 101 and the diaphragm 102, which act as opposite electrodes of a capacitor, are positioned to directly face each other via an air space 108 called a pressure chamber.

Figure 6:
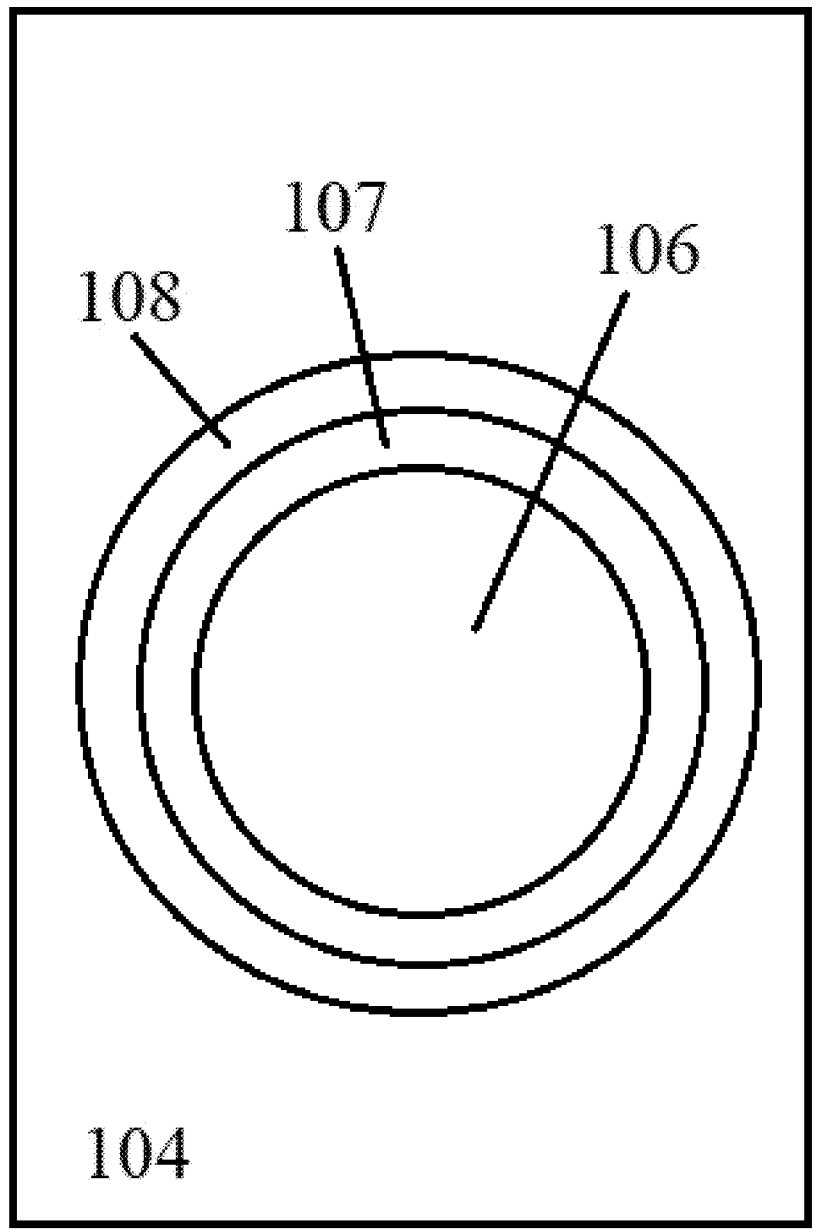
FIG. 6 compares the size of an opening of the intermediate layer with that of a pressure chamber in a MEMS microphone in accordance with an exemplary embodiment of the present invention.

The fixed backplate 101 may contain one or more conductor or insulator layers with various patterns or materials. In preferred embodiments as shown in FIG. 6, a projection of the second opening 107 of the intermediate layer 103 on the substrate layer 104 is smaller than, and completely within, a projection of the body of air 108 ("pressure chamber") on the substrate layer 104. The movable diaphragm 102 may be made of polysilicon.

Referring to FIG. 5, the sidewall 105b may function as an etch stop material (ESM) during the fabrication of the MEMS microphone of the invention. Before the whole structure of FIG. 5 is released and the back cavity 106 is opened, the gap between the movable diaphragm 102 and the fixed backplate 101 (i.e. the body of air 108) is filled with a sacrificial material 109 as shown in FIG. 7.

Figure 7:
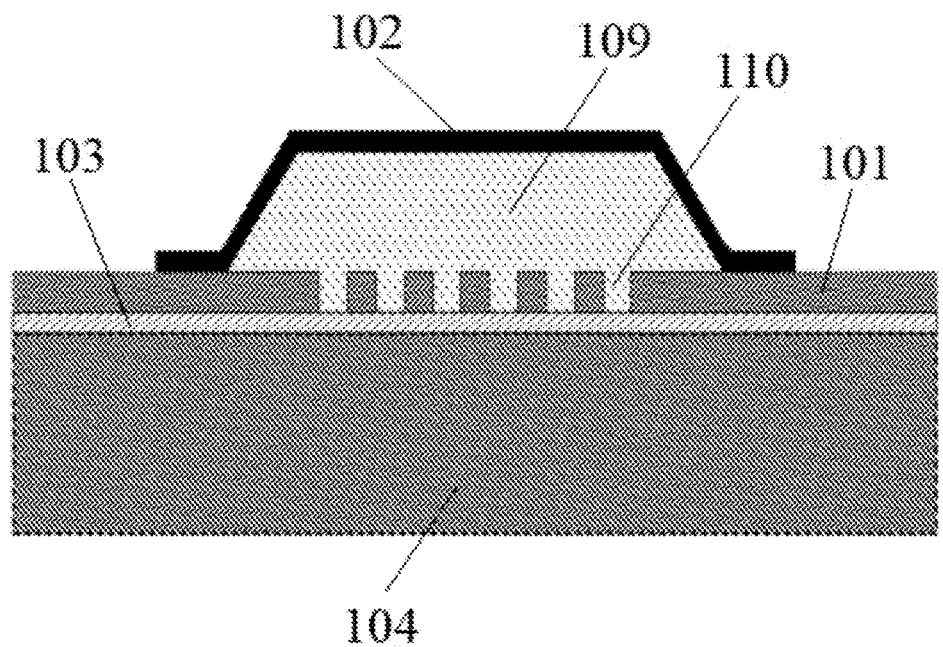
FIG. 7 illustrates a pressure chamber filled with a sacrificial material in accordance with an exemplary embodiment of the present invention.
Figure 8:
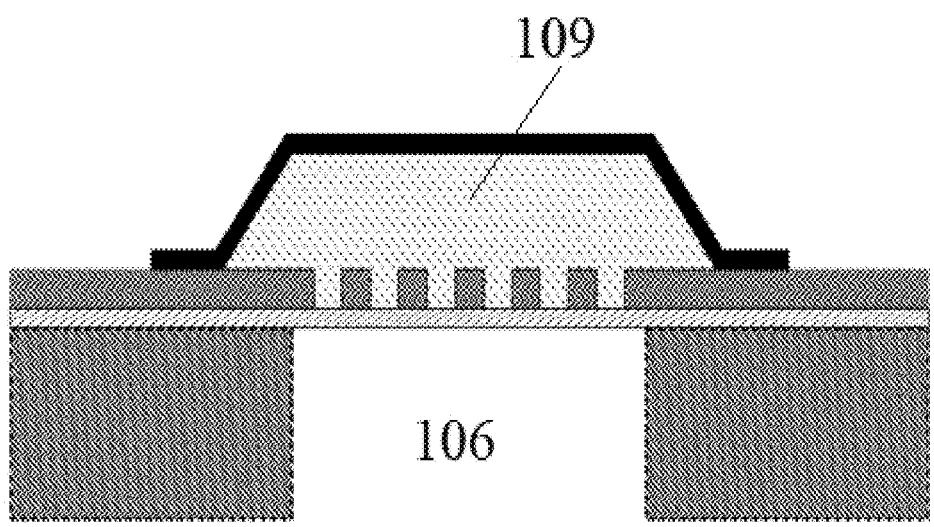
FIG. 8 shows a microphone structure after back cavity etching and before releasing in accordance with an exemplary embodiment of the present invention.

In order to fabricate the structure of FIG. 7 to that of FIG. 5, a process of back cavity 106 etching is needed, and the Etch Stop Material of sidewall 105b is used as an etch stopper to prevent the materials of the fixed backplate from being etched by the etchants of this back cavity etching process. FIG. 8 shows the microphone structure after back cavity etching and before releasing. After the back cavity etching process, another etching process will be performed to remove sacrificial material 109 in the gap and release movable diaphragm 102. The etchants in this process step could be solutions (wet approach) or vapor (dry approach).

Figure 9:
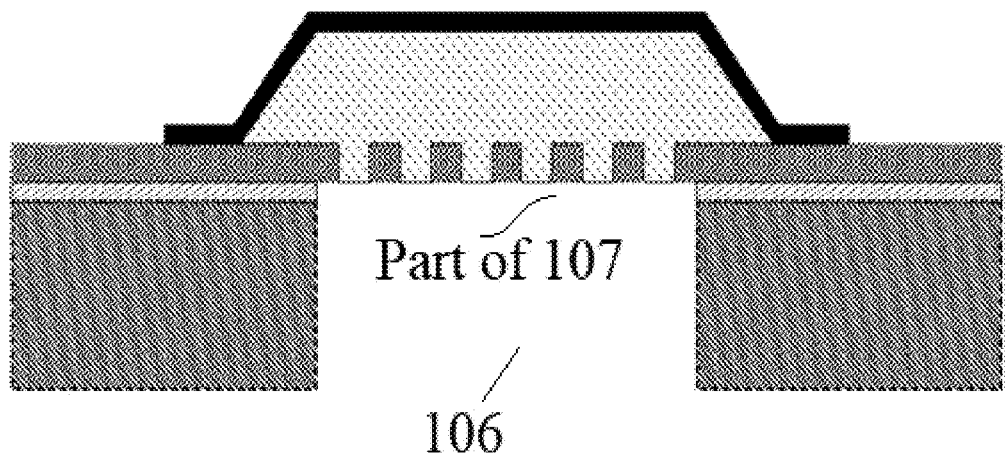
FIG. 9 illustrates etching an opening in the intermediate layer in accordance with an exemplary embodiment of the present invention.

First, the etchants remove the Etch Stop Material of intermediate layer 103 standing at the bottom of the fixed backplate 101, forming a part of opening 107. Then, they will start to etch sacrificial material 109, as FIG. 9 demonstrates. The etchants may go through the cavities, through holes, bores or openings 110 (which may have shapes or patterns like holes, polygons, or slots) on fixed backplate 101 and remove sacrificial material 109 over it, finally forming a structure as FIG. 5 shows.

Figure 10:
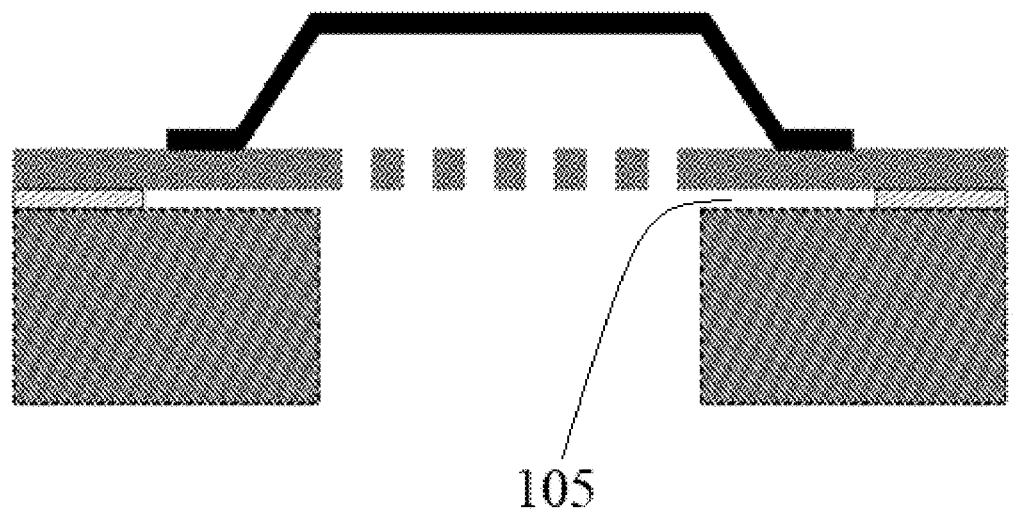
FIG. 10 illustrates a microphone structure with an oversized undercut in accordance with an exemplary embodiment of the present invention.

However, most releasing etchants are isotropic, and the Etch Stop Material of intermediate layer 103 on the side of back cavity 106 and under the materials of fixed backplate 101 could be further removed while the sacrificial material 109 is being etched. If the releasing process takes too long time (releasing time depends on many factors such as volume, shape or material properties of Sacrificial Material 109), the Etch Stop Material of intermediate layer 103 under Fixed Backplate 101 could be etched too much, forming an oversized undercut 105, as FIG. 10 shows. The structure of FIG. 10 is less preferred because the Movable Diaphragm 102 is anchored on a suspended structure, which may result in a losing of stability and less satisfactory performance, as compared to the structure shown in FIG. 5. In FIG. 10, the projection of the second opening 107 on the substrate layer 104 is bigger than the projection of the body of air 108 on the substrate layer 104, opposite to that as shown in FIG. 6.

Figure 11:
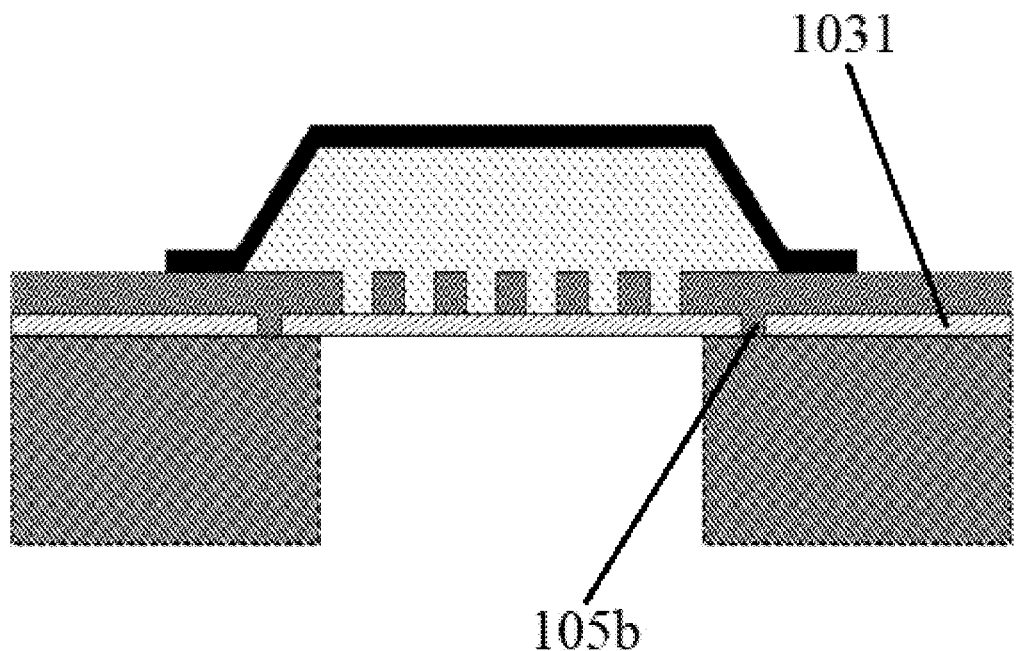
FIG. 11 illustrates a backplate sealing trench in the intermediate layer in accordance with an exemplary embodiment of the present invention.

In order to avoid the undesired structure shown in FIG. 10, a fabrication process as shown in FIG. 11 is invented. FIG. 11 shows the microphone structure with a backplate sealing trench before releasing. Before backplate 101 material deposition, a shallow trench (for forming sidewall 105b) is opened on Etch Stop Material (intermediate layer 103). The trench shape is like a loop on the top view. While the backplate material is depositing, the shallow trench opened on intermediate layer 103 is filled with the backplate material. The backplate material filled in the trench is acting like a sealing wall 105b to prevent the Etch Stop Material behind (outside) the wall 105b (i.e. the peripheral portion 1031 surrounding the looped sidewall 105b as shown in FIG. 4) from being deteriorated by the releasing etchants.

Figure 12:
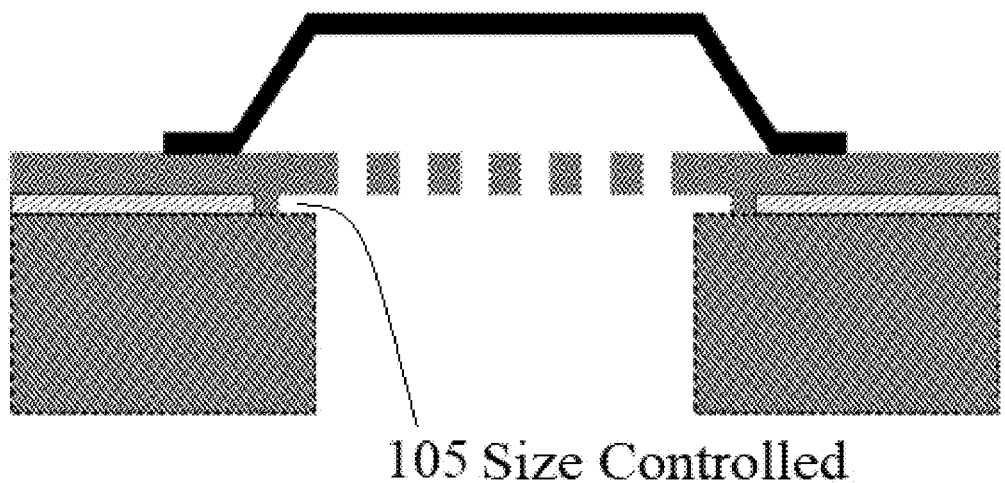
FIG. 12 illustrates a microphone structure with a well-controlled undercut in accordance with an exemplary embodiment of the present invention.

FIG. 12 shows the microphone structure with a backplate sealing trench after releasing. The etch stop material under the anchor area of movable diaphragm 102 is protected by the material of fixed backplate 101 filling in the trench during the whole period of releasing process, which ensures a looped recess 105 with controlled size, and movable diaphragm 102 can stand on firm and solid materials instead of standing on suspended materials as shown in FIG. 10.

Figure 13:
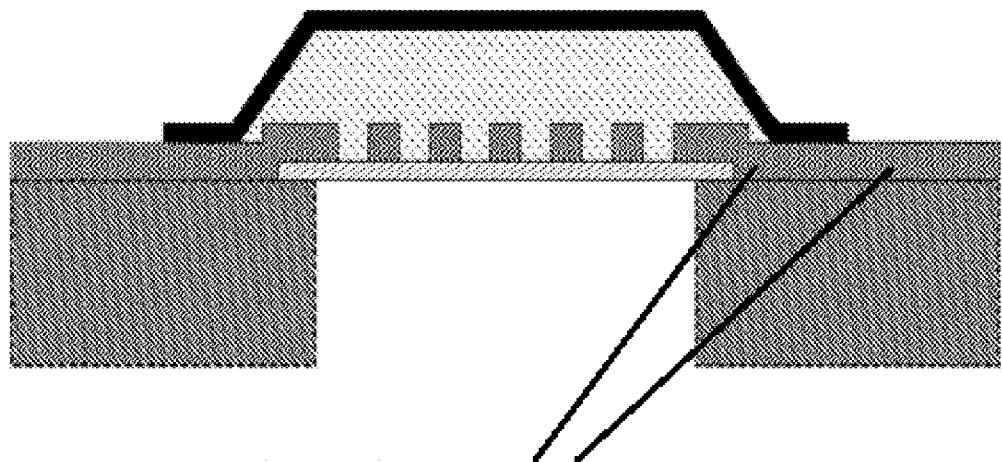
FIG. 13 illustrates an intermediate layer entirely made of a same material such as silicon nitride in accordance with an exemplary embodiment of the present invention.
Figure 14:
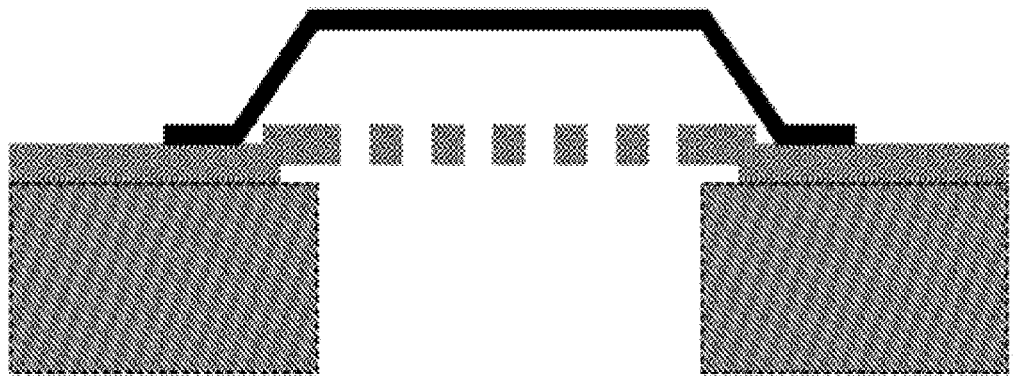
FIG. 14 illustrates the anchor area of a movable diaphragm standing on firm and solid materials in accordance with an exemplary embodiment of the present invention.

In other embodiments as shown in FIG. 13, the backplate sealing trench may not be limited as a shape of trench opened in the etch stop material. It can also be as a step that removes a large part of the etch stop material. In other words, both the looped sidewall 105b and the peripheral portion 1031 of the intermediate layer 103 are integrated and made of same material such as silicon nitride. Instead of removing a narrow material band to form a looped trench, more material is removed by this approach as shown in FIG. 13. The materials of the fixed backplate 101 are deposited directly over the substrate. More material from the fixed backplate is bonded to the substrate, ensuring the anchor area of movable diaphragm 102 standing on firm and solid materials, as shown in FIG. 14. In this embodiment, even all the etch stop material is removed by the releasing process, the mechanical performance of movable diaphragm 102 will not be affected.

Figure 15:
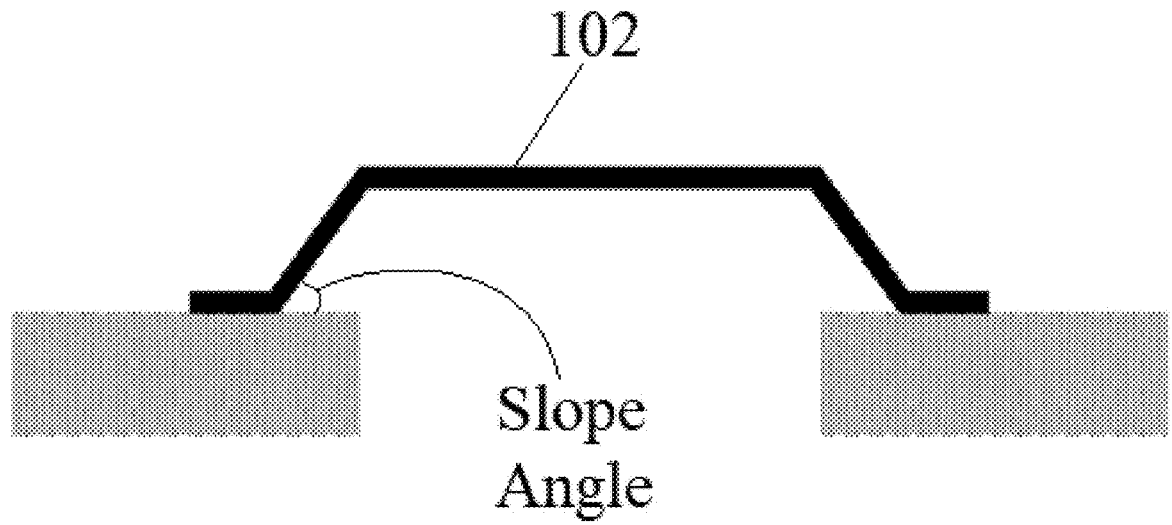
FIG. 15 illustrates a movable diaphragm with a corrugated shape in accordance with an exemplary embodiment of the present invention.
Figure 16:
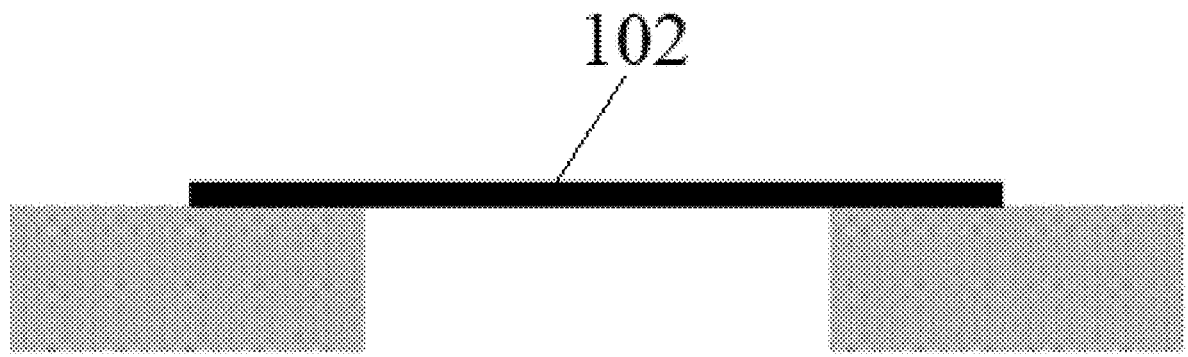
FIG. 16 illustrates a plain diaphragm in a microphone of the prior art.
Figure 17:
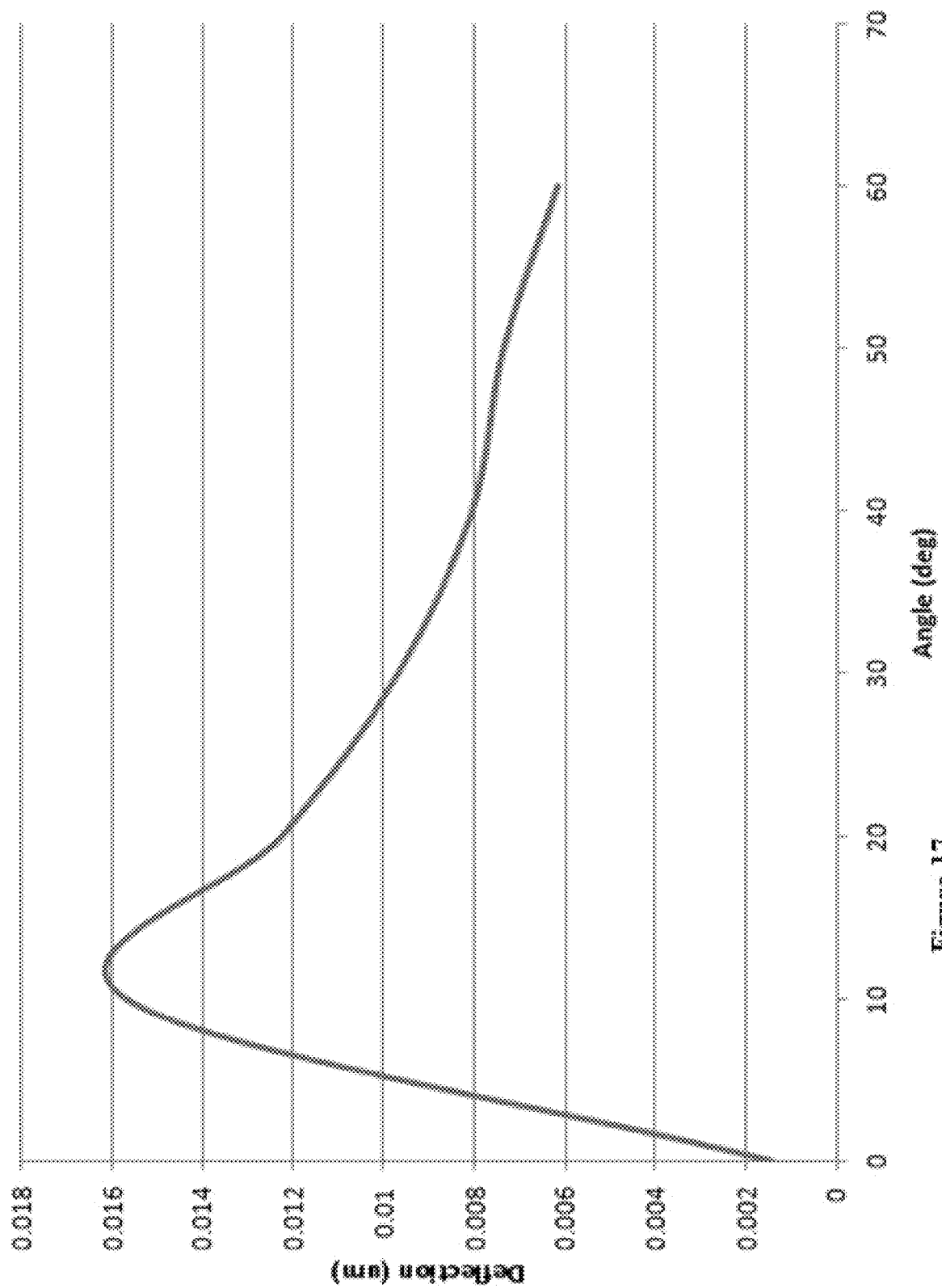
FIG. 17 depicts the deflection of a movable diaphragm under 1 Pa pressure with different diaphragm corrugation slope angle in accordance with an exemplary embodiment of the present invention.

In some of the embodiments as described above, the movable diaphragm 102 of MEMS microphone has a corrugated shape as shown in FIG. 15, which enhances the mechanical sensitivity compared with a plain diaphragm 102 as shown in FIG. 16. The mechanical sensitivity of a diaphragm refers to the ability of detecting acoustic pressure applied on the diaphragm area and responding as deflection. A diaphragm with higher mechanical sensitivity has a larger material elastic deflection under same pressure applied. FIG. 17 depicts the deflection of a movable diaphragm under 1 Pa pressure with different diaphragm corrugation slope angle. FIG. 17 shows a series of FEA (finite elements analysis) simulation data that are diaphragm deflections under 1 Pa pressure with different slope angles. For example, a corrugated diaphragm with 40° slope angle has about 4 times larger elastic deflection than a plain(0°) diaphragm. Although a corrugated diaphragm with less than 20° slope angle has dramatically increased deflection, it is not preferable in mass production. With same tolerance level during wafer manufacturing, such as ±5° on slope angle, a diaphragm with a slope angle in the range of 20° to 60° has less sensitivity change than a diaphragm with slope angle smaller than 20°.

Figure 18:
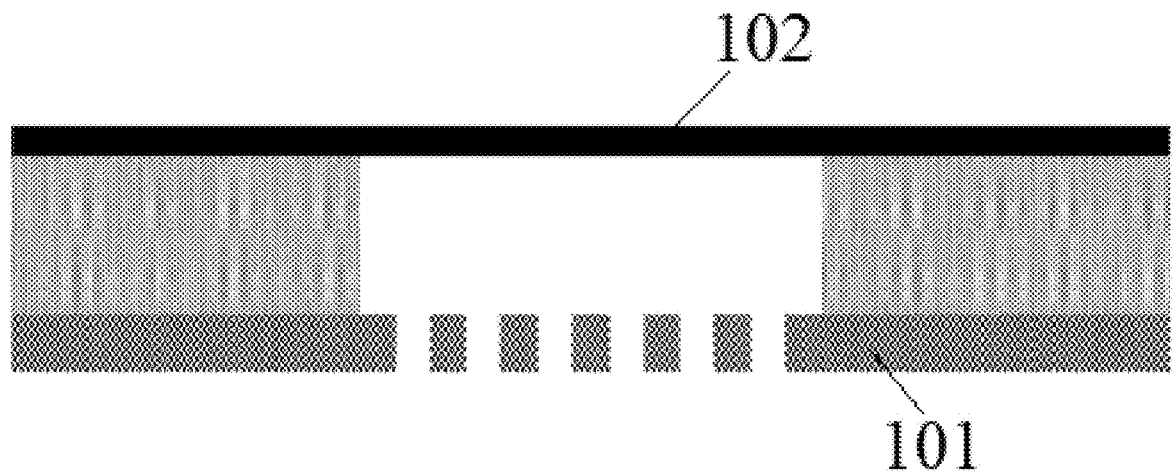
FIG. 18 illustrates a microphone structure with a movable diaphragm on the top of a backplate in accordance with an exemplary embodiment of the present invention.
Figure 19:
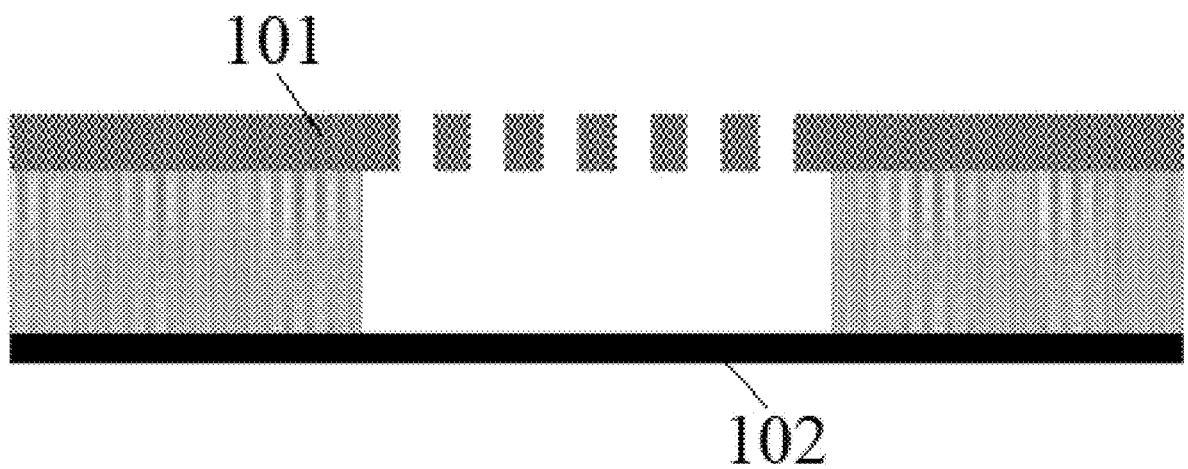
FIG. 19 illustrates a microphone structure with a backplate on the top of a movable diaphragm in accordance with an exemplary embodiment of the present invention.

Further, for a MEMS (micro-electric-mechanical-system) microphone with a plain diaphragm 102, additional supporting materials are needed to be deposited in order to create the gap between diaphragm 102 and backplate 101, no matter which one is on the top of another one, such as plain diaphragm 102 on the top of backplate 101 as shown in FIG. 18, or backplate 101 on the top of plain diaphragm 102 as shown in FIG. 19. While a microphone with corrugated diaphragm as shown in FIG. 5 creates the gap by the corrugation itself.

Figure 20:
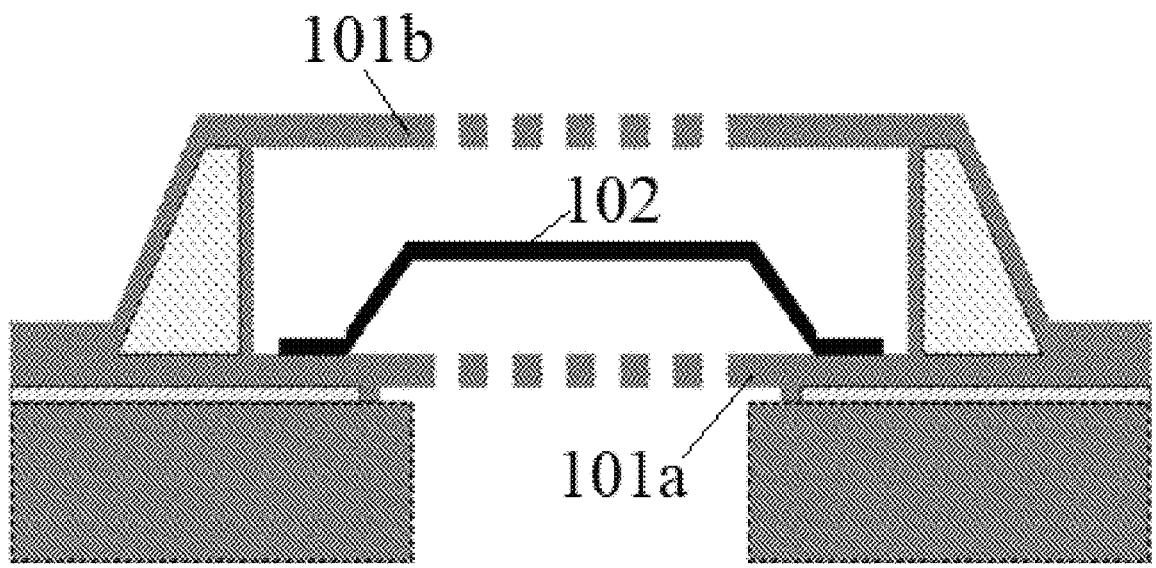
FIG. 20 illustrates a microphone structure with two fixed backplates on both side of a movable diaphragm in accordance with an exemplary embodiment of the present invention.
Figure 21:
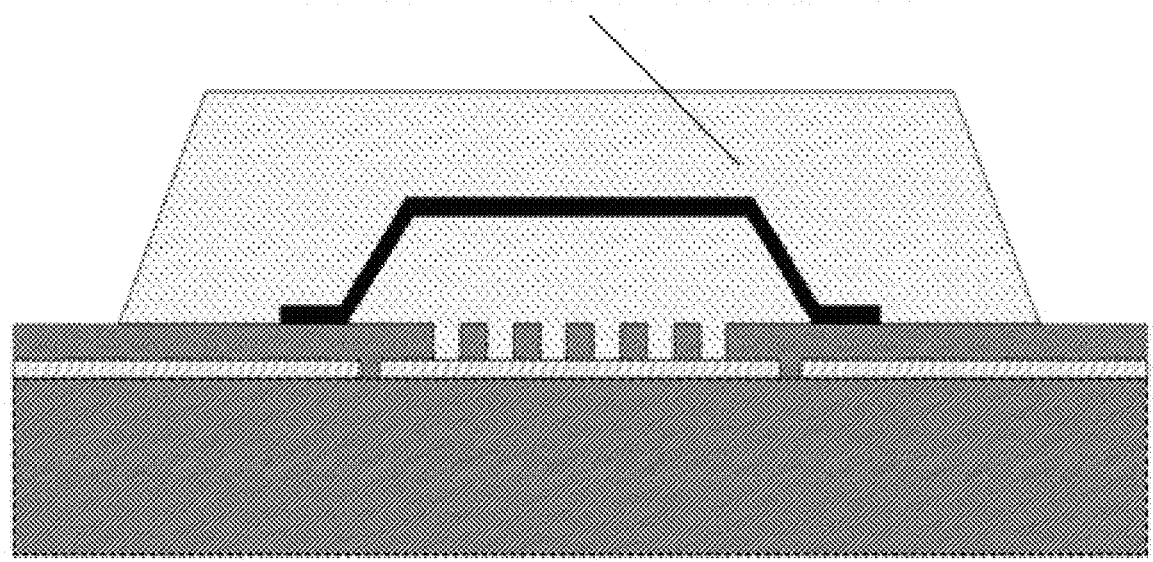
FIG. 21 illustrates a second sacrificial material for fabricating a second fixed backplate in accordance with an exemplary embodiment of the present invention.

In some embodiments of the invention, the MEMS microphones may have a structure as shown in FIG. 20 with fixed backplates (101a and 101b) on both side of movable diaphragm 102. There are two extra materials compared with that in FIG. 12, one of which is a second sacrificial material surrounding the diaphragm 102 by its side, and another one of which is the second fixed backplate 101b (or an additional fixed backplate 101b) over the movable diaphragm 101 by a second gap and covering the second sacrificial material. The second fixed backplate can almost double the overall sensitivity of the microphone, which renders the microphone an ultra-high performance. In order to fabricate this structure, a second sacrificial material is firstly deposited and patterned over the movable diaphragm 102 layer, as shown in FIG. 21. The second sacrificial material is used to create the gap between movable diaphragm 102 and the second fixed backplate 101b, and also acts as supporting anchor material of the second fixed backplate 101b.

Figure 22:
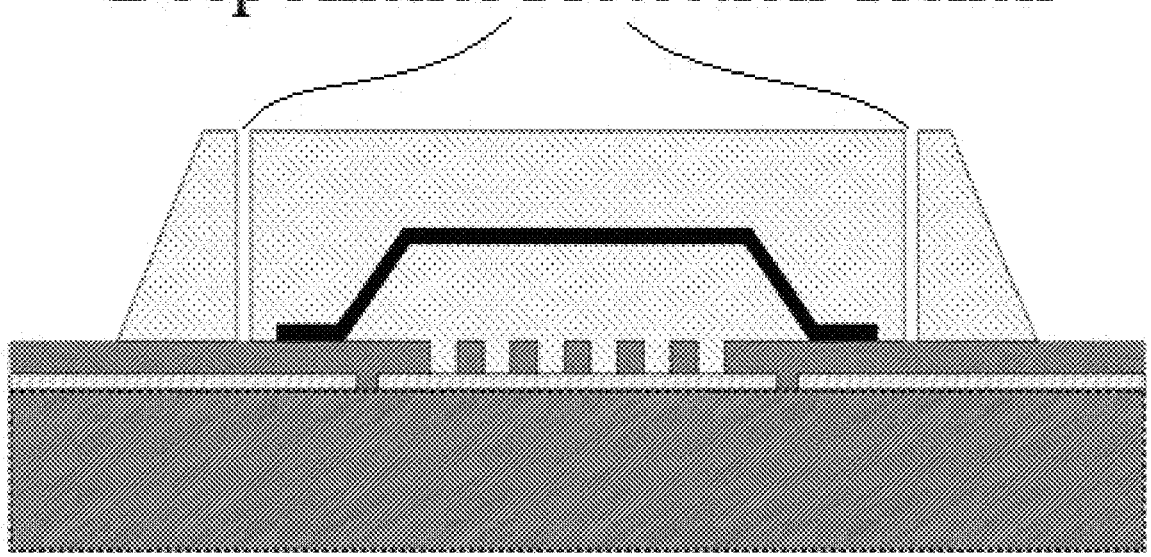
FIG. 22 illustrates a deep anchor protection trench opened on the second sacrificial material of FIG. 21 in accordance with an exemplary embodiment of the present invention.
Figure 23:
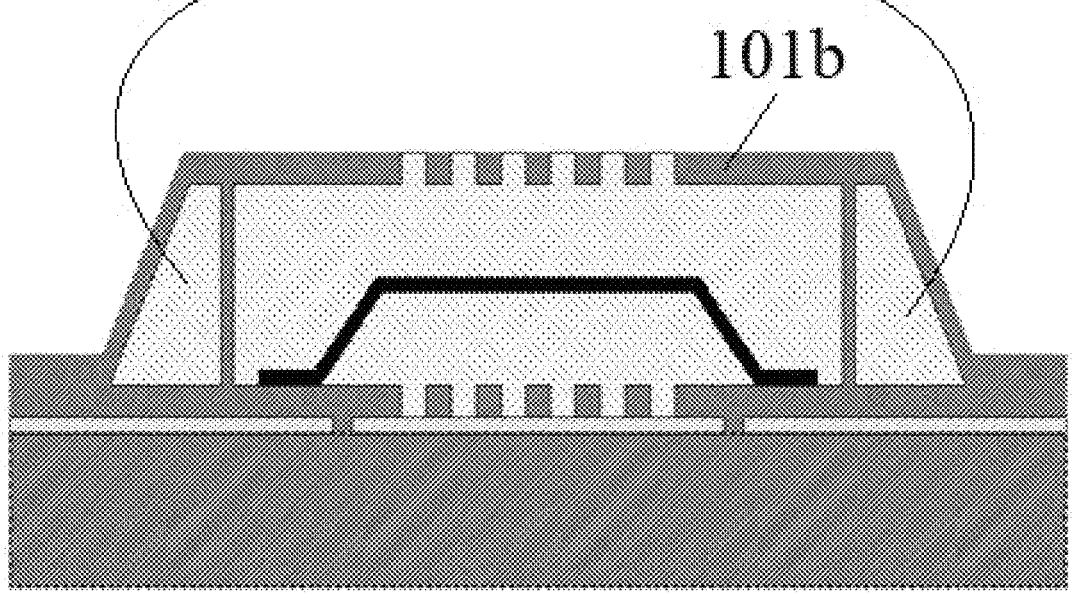
FIG. 23 illustrates a "looped" supporting anchor for the second fixed backplate in accordance with an exemplary embodiment of the present invention.

In order to keep a part of second sacrificial material as the supporting anchor material and prevent it from being removed during releasing process, it may be covered by a protective layer that can stand releasing process. FIG. 22 illustrates a deep anchor protection trench opened on the second sacrificial material. While the material of the second fixed backplate 101b is being deposited, the trench will be filled by said material, which covers a part of the second sacrificial material as a "looped" supporting anchor, as shown in FIG. 23. Then the back cavity opening module and the releasing module are applied to the structure. With all uncovered sacrificial material removed by releasing module, the final structure as shown in FIG. 20 is fabricated completely.

Figure 24:
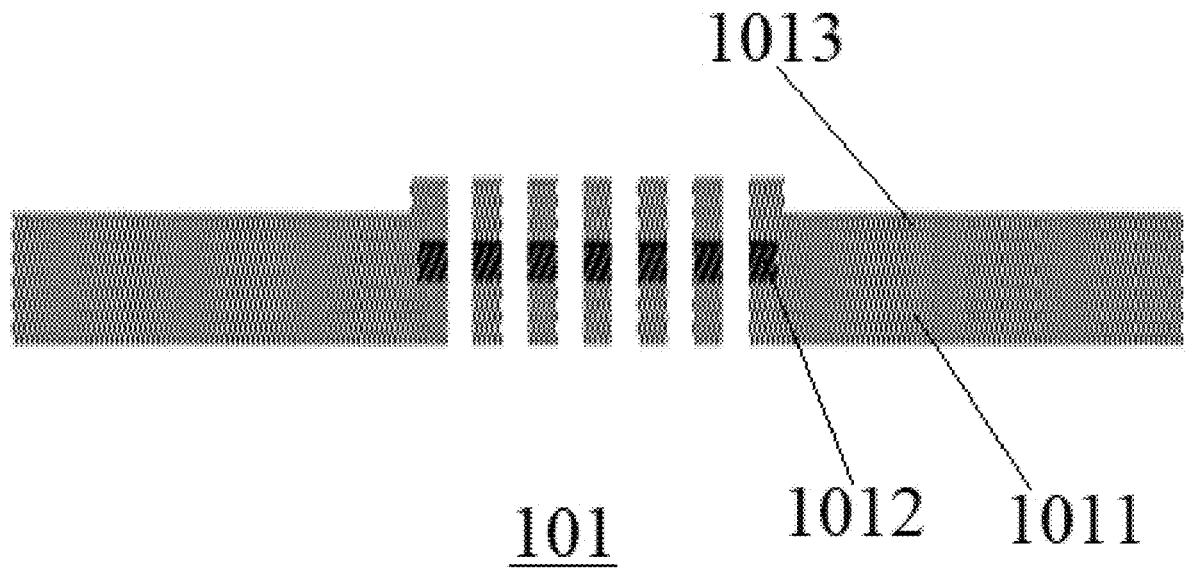
FIG. 24 illustrates the sandwich structure of a fixed backplate in accordance with an exemplary embodiment of the present invention.

In some embodiments, a fixed backplate (e.g. 101, 101a and/or 101b) may have a sandwich structure with one conductor layer in the center and two insulator layers on the two sides. FIG. 24 illustrates the sandwich structure of a fixed backplate, which includes a first insulator layer 1011, a conductor layer 1012 and a second insulator layer 1013. To fabricate this structure, a first insulator layer 1011 is deposited first, and then a conductor layer 1012 is deposited and patterned over the first insulator layer 1011. Then a second insulator layer 1013 is deposited over the conductor layer 1012, forming a sandwich structure that waits for being patterned.

Figure 25:
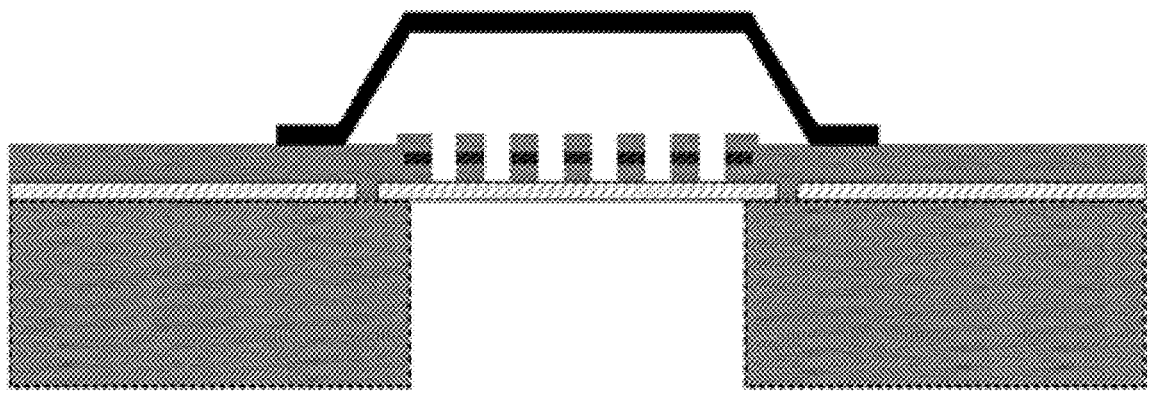
FIG. 25 illustrates a microphone with one fixed backplate of sandwich structure in accordance with an exemplary embodiment of the present invention.

The sandwich structure may be used in the first fixed backplate (101 or 101a) and/or the second fixed backplate (101b) as described above. For example, FIG. 25 shows a sandwich structure of fixed backplate 101/101a with backplate sealing trench. Because the material that bonded with the substrate through the backplate sealing trench is insulator, undesired electric connection is avoided.

Figure 26:
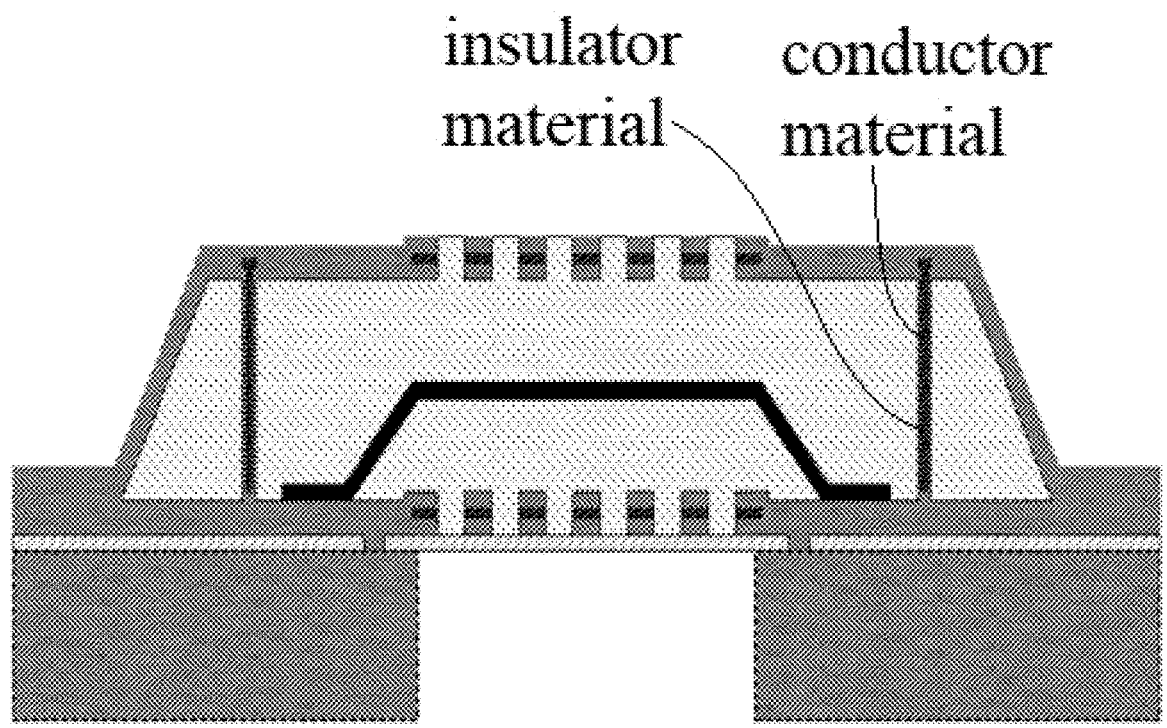
FIG. 26 illustrates a microphone with two fixed backplates of sandwich structure before the releasing process in accordance with an exemplary embodiment of the present invention.
Figure 27:
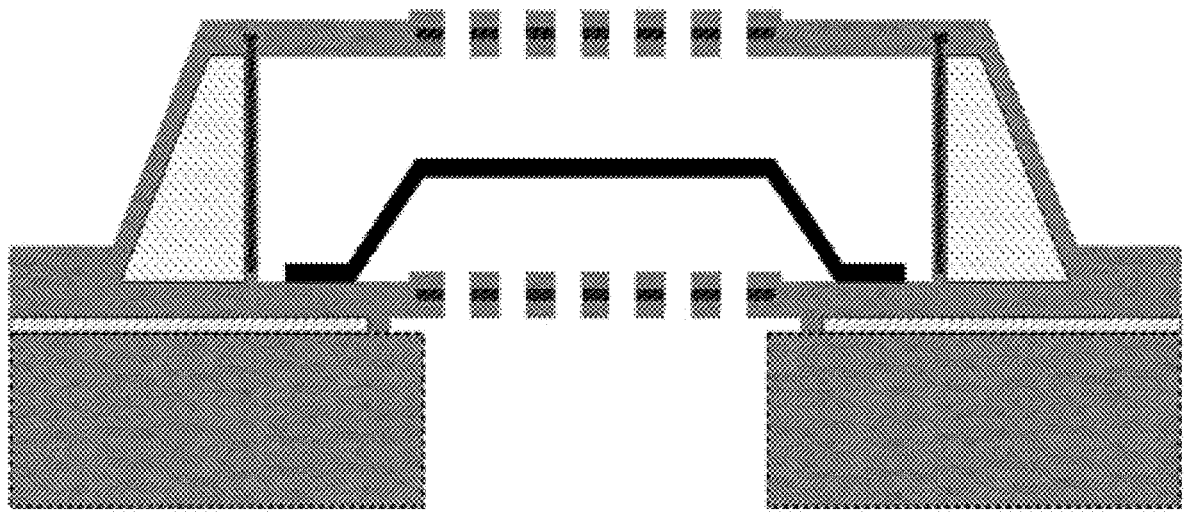
FIG. 27 illustrates a microphone with two fixed backplates of sandwich structure after the releasing process in accordance with an exemplary embodiment of the present invention.

Similarly, the second fixed backplate 101b can also have the sandwich structure. As FIG. 26 shows, if some insulator materials do not have a perfect ability to fulfill the Deep Anchor Protection Trench that is almost vertical, then a conductor material may further fulfill the remaining trench space left (or unfilled) by the insulator material, before the releasing process. Since both the insulator material and the conductor material can stand during the releasing process, the MEMS microphone structure after the releasing process will be like that shown in FIG. 27.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A MEMS microphone comprising (i) a substrate layer, (ii) a fixed backplate above the substrate layer and parallel thereto, (iii) an intermediate layer sandwiched between the substrate layer and the fixed backplate, and (iv) a movable diaphragm above the fixed backplate and separated therefrom with a body of air;
wherein the substrate layer has a first opening through the thickness of the substrate layer;
wherein the intermediate layer has a second opening through the thickness of the intermediate layer;
wherein the fixed backplate forms a ceiling of the second opening, and the second opening is larger than the first opening and extends into the first opening, forming a looped recess defined by a looped ledge on the substrate, a looped sidewall around the second opening, and a looped ceiling from the fixed backplate; and
wherein the looped sidewall and the looped ceiling are made of a same material.

2. The MEMS microphone according to claim 1, wherein the intermediate layer consists of the looped sidewall and a peripheral portion around said looped sidewall.

3. The MEMS microphone according to claim 2, wherein the peripheral portion is made of a material different from the looped sidewall material.

4. The MEMS microphone according to claim 3, wherein the substrate layer is made of Si, the looped sidewall of the intermediate layer is made of silicon nitride, and the peripheral portion of the intermediate layer is made of silicon oxide.

5. The MEMS microphone according to claim 4, wherein the looped sidewall of the intermediate layer extends or integrates into at least a portion of the fixed backplate, or wherein at least a portion of the fixed backplate immediately adjacent to and contacting an entire top surface of the looped sidewall of the intermediate layer is also made of silicon nitride.

6. The MEMS microphone according to claim 5, wherein the peripheral portion of the intermediate layer does not extend into (materially distinct from) the fixed backplate, and wherein a portion of the fixed backplate immediately adjacent to and contacting an entire top surface of the peripheral portion of the intermediate layer is also made of silicon nitride.

7. The MEMS microphone according to claim 2, wherein the peripheral portion is made of a material same as the looped sidewall material.

8. The MEMS microphone according to claim 7, wherein the substrate layer is made of Si, and both the looped sidewall and the peripheral portion of the intermediate layer are made of silicon nitride.

9. The MEMS microphone according to claim 8, wherein both the looped sidewall and the peripheral portion of the intermediate layer extend into at least a portion of the fixed backplate, or wherein at least a portion of the fixed backplate immediately adjacent to and contacting an entire top surface of both the looped sidewall and the peripheral portion of the intermediate layer is also made of silicon nitride.

10. The MEMS microphone according to claim 1, wherein the term "looped" represents a shape or contour of circle, square, or rectangular.

11. The MEMS microphone according to claim 1, wherein a projection of the second opening on the substrate layer is smaller than, and completely within, a projection of the body of air on the substrate layer.

12. The MEMS microphone according to claim 1, wherein the movable diaphragm is made of polysilicon.

13. The MEMS microphone according to claim 1, wherein the fixed backplate has holes for the body of air to flow through and into the first opening.

14. The MEMS microphone according to claim 1, wherein the movable diaphragm is corrugated.

15. The MEMS microphone according to claim 14, wherein the corrugated movable diaphragm has a slope angle in the range of 20° to 60°.

16. The MEMS microphone according to claim 1, further comprising a second fixed backplate (or an additional fixed backplate) above the movable diaphragm.

17. The MEMS microphone according to claim 16, wherein the second fixed backplate is supported by a looped supporting anchor.

18. The MEMS microphone according to claim 16, wherein the second fixed backplate has a sandwich structure with one conductor layer in the middle and two insulator layers on two sides of the conductor layer.

19. A MEMS microphone comprising (i) a substrate layer, (ii) a fixed backplate above the substrate layer and parallel thereto, and (iii) an intermediate layer sandwiched between the substrate layer and the fixed backplate:
  wherein the substrate layer has a first opening through the thickness of the substrate layer;
  where the intermediate layer has a second opens ugh the thickness of the intermediate layer;
  wherein the fixed backplate forms a ceiling of the second opening, and the second opening is larger than the first opening and extends into the first opening, forming a looped recess defined by a looped ledge on the substrate, a looped sidewall around the second opening and a looped ceiling from the fixed backplate;
  wherein the looped sidewall and the looped ceiling are made of a same material; and
  wherein the fixed backplate has a sandwich structure with one conductor layer in the middle and two insulator layers on two sides of the conductor layer.

* * * * *